United States Patent [19]

Severson

[11] 4,394,682

[45] Jul. 19, 1983

[54] DC SWITCHING CIRCUIT

[75] Inventor: Eugene K. Severson, Colorado Springs, Colo.

[73] Assignee: Hewlett-Packard Company, Palo Alto, Calif.

[21] Appl. No.: 311,130

[22] Filed: Oct. 14, 1981

Related U.S. Application Data

[62] Division of Ser. No. 968,244, Dec. 11, 1978, Pat. No. 4,346,308.

[51] Int. Cl.³ .............................................. H04N 9/27
[52] U.S. Cl. .................................................... 358/73
[58] Field of Search ..................... 358/74, 73; 340/701, 340/704; 307/252 B, 75, 77, 81; 315/170, 172

[56] References Cited

U.S. PATENT DOCUMENTS 4,104,564  8/1978  Cohen et al. ........................... 358/73
4,160,996  7/1979  Nigra et al. ............................ 358/73

Primary Examiner—John C. Martin
Attorney, Agent, or Firm—Edward L. Miller

[57] ABSTRACT

A tri-color cathode ray tube has three DC voltage supplies and three strings of triacs. Each string is coupled between one of the supplies and the anode of the cathode ray tube for selectively applying the voltage from the one supply to the anode. The tri-color display is provided by directing an electron beam from the cathode of the cathode ray tube to beam penetration phosphors on the display screen of the cathode ray tube which selectively produce colors in response to the beam and the selected voltage applied thereto.

4 Claims, 5 Drawing Figures

DC SWITCHING CIRCUIT

CROSS REFERENCE TO RELATED APPLICATION

This is a division of application Ser. No. 968,244, filed Dec. 11, 1978, now U.S. Pat. No. 4,346,308.

BACKGROUND AND SUMMARY OF THE INVENTION

High resolution color cathode ray tubes (CTR's) commonly use a variable-voltage beam penetration phosphor technique to generate different colors. Post-accelerator voltage changes of several thousand volts are required to implement this technique. In high-speed, high-resolution color cathode ray tubes, it is desirable to switch between these voltages quickly and to accurately repeat the values of each of the voltages so that colors can be quickly switched and accurately reproduced.

The preferred embodiment of the present invention incorporates a tri-color cathode ray tube. The three DC voltages required to provide the three different colors are supplied by three DC voltage supplies. Each supply is selectively coupled to the cathode ray tube by an associated string of triacs activated by a corresponding trigger circuit. The rate of switching is determined and, if it exceeds a predetermined value, switching is inhibited.

DETAILED DESCRIPTION OF THE PREFERRED EMBODIMENT

Figure 1:
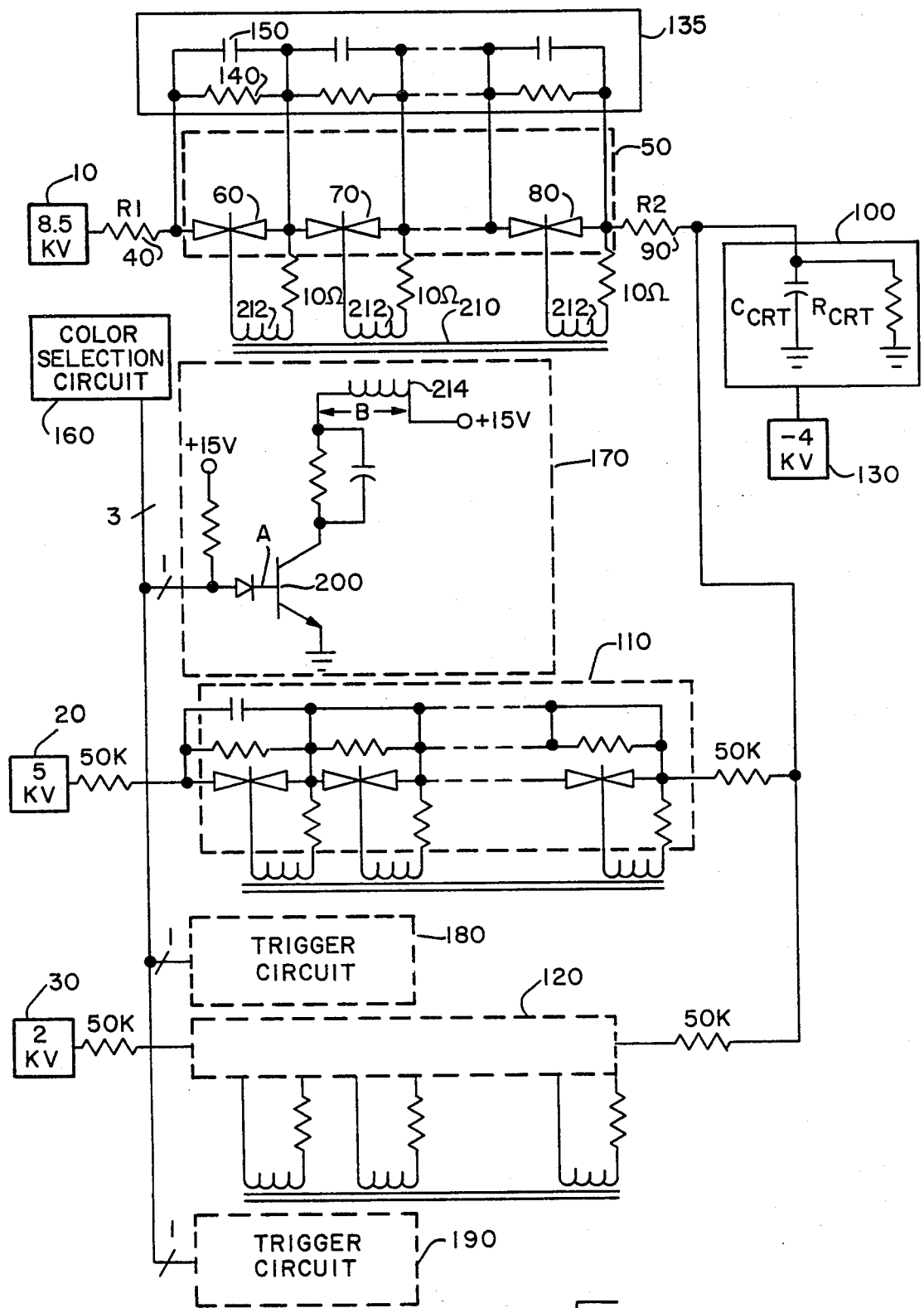
FIG. 1 is a detailed schematic diagram of the preferred embodiment of the present invention.

FIG. 1 is a detailed schematic diagram of the preferred embodiment of the present invention. DC voltages are supplied by three independent high-voltage DC supplies 10, 20, and 30, which supply voltages of 8.5 kilovolts, 5 kilovolts, and 2 kilovolts, respectively. DC supply 10 is coupled through a 50KΩ resistor 40 to a first terminal of a serial string of triacs 50, including triacs 60, 70, and 80. A second terminal of the serial string of triacs 50 is coupled through a 50KΩ resistor 90 to the anode of a cathode ray tube 100, modeled in FIG. 1 as the parallel combination of a capacitor $C_{crt}$ and a resistor $R_{crt}$. Similarly, DC supplies 20 and 30 are coupled to the anode of cathode ray tube 100 by triac strings 110 and 120 respectively. A −4 KV DC supply 130 is coupled to the cathode of the CRT 100 to provide a range of total electron beam energies from 6 to 12.5 KV.

In the illustrated embodiment, a red color is generated by coupling the 2 kilovolt DC supply 30 to the anode of cathode ray tube 100. A yellow color is generated by coupling the 5 kilovolt DC supply 20 to the anode of the cathode ray tube and a green color is generated by coupling the 8.5 kilovolt DC supply 10 to the anode of the cathode ray tube.

Triacs, such as those used in the triac strings, are three-terminal devices which switch to a conductive state in response to the application of a signal to a gate terminal and remain in this conductive state until the gate signal is removed and the conducted current falls below a minimum holding current level. Triacs conduct current in either direction and have a small voltage drop across the conducting terminals when in the conductive state. When triacs are not conducting they will sustain large voltage differentials of either polarity across their terminals if DV/DT and blocking voltage specifications are not exceeded. The serial string of triacs 50 in FIG. 1 comprises fifteen triacs each having a blocking voltage specification of 600 volts, and effectively blocks a voltage of 9,000 volts. This blocking capability is sufficient to block the voltage between the 8.5 kilovolt DC supply 10 and the anode of cathode ray tube 100 when 2 kilovolt DC supply 30 is coupled to the cathode ray tube. Similarly, triac string 120 comprises fifteen triacs. Triac string 110 coupled to the 5 kilovolt DC supply 20 blocks a lower absolute voltage differential, therefore, requires only nine triacs.

The triacs used in the preferred embodiment of the present invention are part No. 2N5757 manufactured by either RCA or Raytheon. Only devices which have a DV/DT specification of greater than 100 volts per microsecond, that is, only devices which remain nonconductive when the specified voltage change is applied across the conductive terminals thereof, are used. This selection ensures that the triac strings will not trigger to a conductive state in response to the rapid voltage changes across terminals caused by switching between the DC supplies. Further, the triacs have been selected such that the leakage current through the conductive terminals is less than 10 microamps at the full blocking voltage of 600 volts. This selection ensures that a shunt circuit 135, comprising a 4.7 megohm resistor and a 220 pf capacitor coupled in parallel with each triac, such as resistor 140 and capacitor 150 coupled to triac 60, can equalize the voltages across a given string of triacs and ensure the synchronous operation of the triacs in that string.

A color selection circuit 160 selectively applies a triggering signal A to one of three trigger circuits. Trigger circuit 170 is coupled to triac string 50. Similarly, a trigger circuit 180 is coupled to triac string 110 and a trigger circuit 190 is coupled to triac string 120. Color selection circuit 160 and the trigger circuits gate the triac strings in a controlled manner such that only one of the triac strings is in a conductive state at any one time.

Figure 3A:
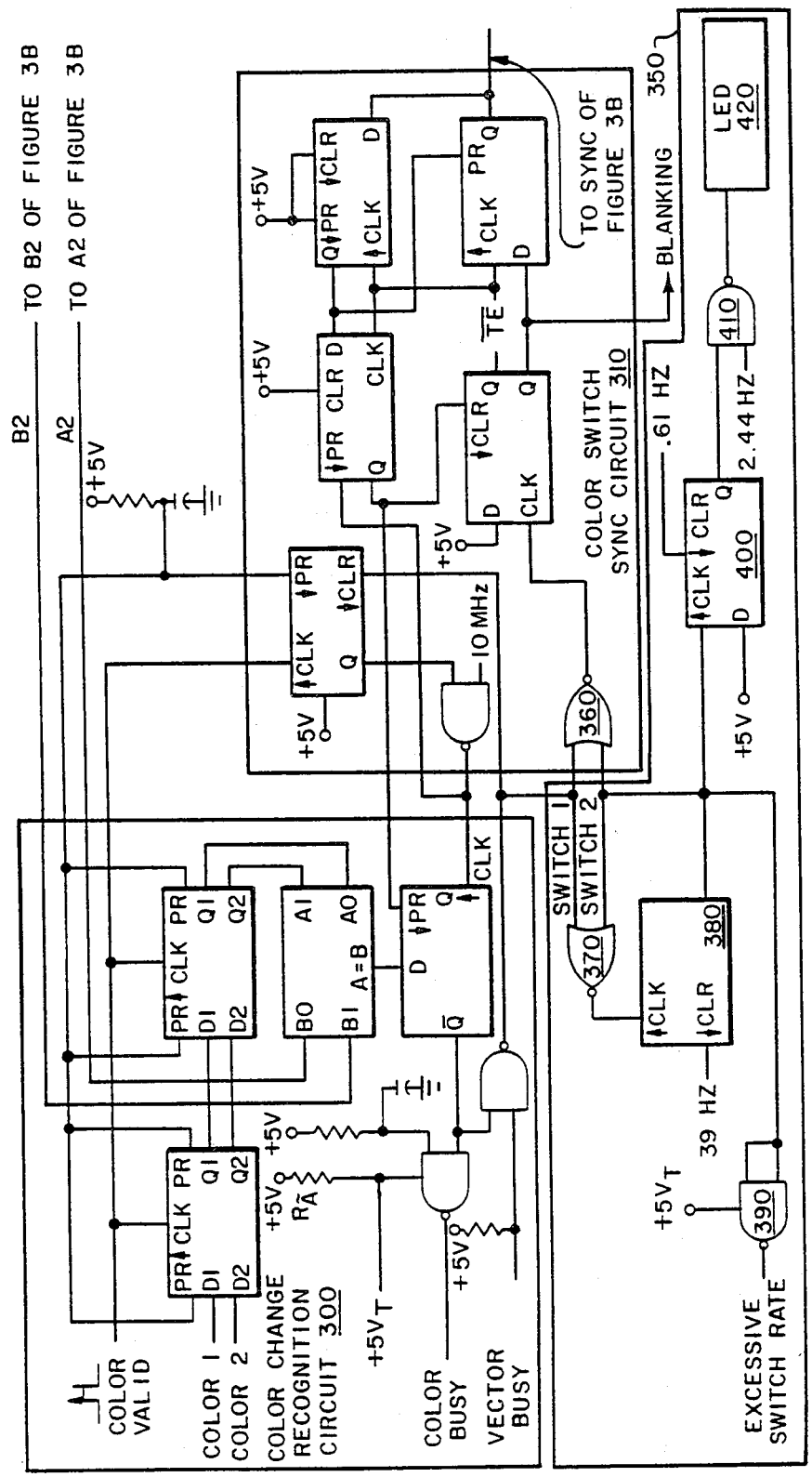
FIGS. 3A and 3B are detailed schematic diagrams of the color selection circuit of FIG. 1.
Figure 3B:
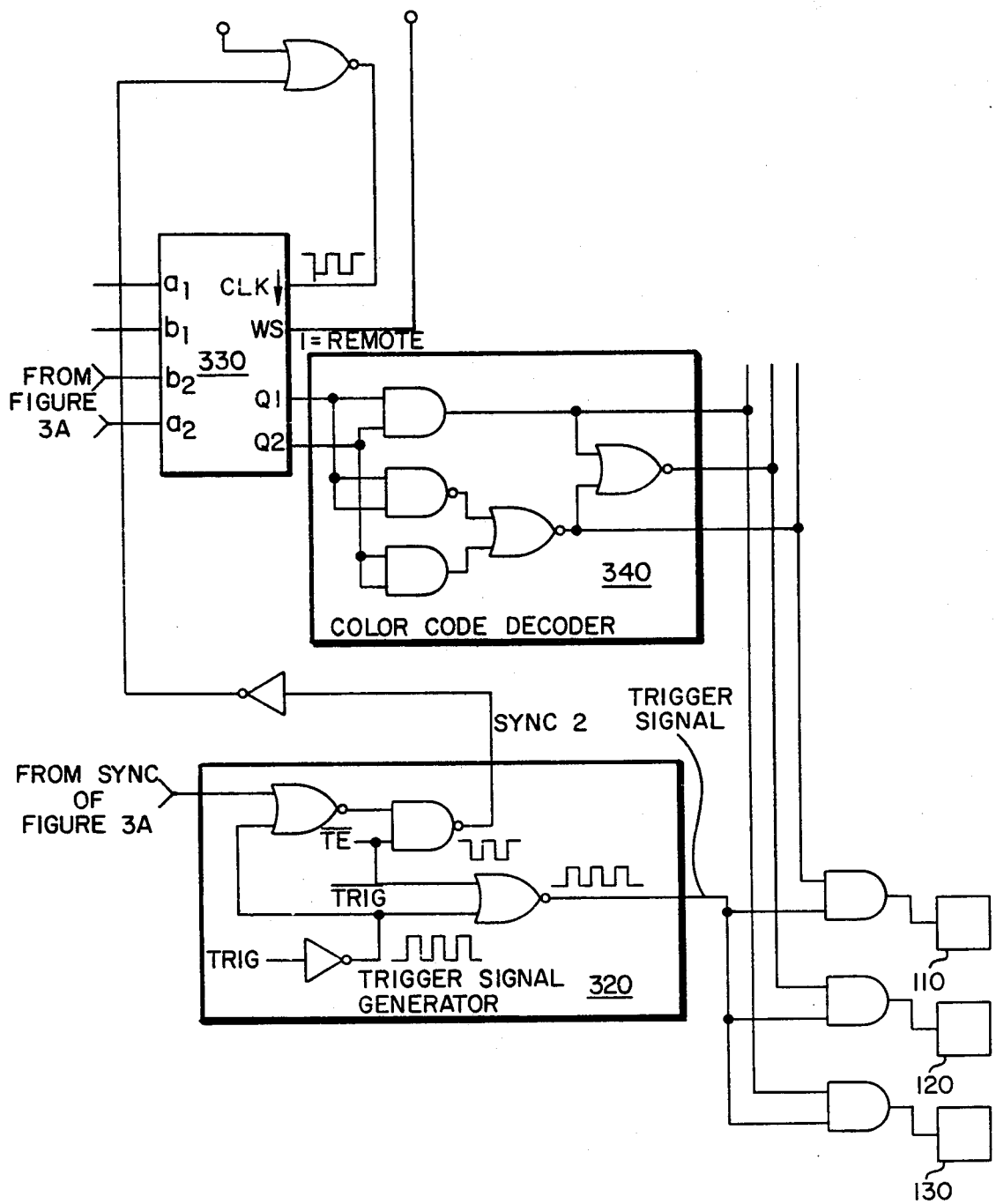

The color selection circuit 160 is illustrated in the detailed schematic diagram FIGS. 3A and 3B. Color change recognition circuit 300 receives color valid, color 1, color 2, and vector busy signals and produces color busy, A2 and B2 signals. The selected color is determined in response to the signals appearing on the color 1 and color 2 inputs and the occurrence of a color valid signal. A signal corresponding to the selected color is latched and output as signals A2 and B2. This selected color is also compared to the previously selected color and, if a new color has been selected, a color busy signal is output indicating that the switching associated with a color change is in progress. The color change recognition circuit 300 is also coupled to color switch sync circuit 310. In response to the vector busy signal indicating that no further vectors are to be drawn with the previous color, the sync circuit 310 initiates the switching process to the newly selected color.

Once the color switching process is initiated, sync circuit 310 synchronizes on the next positive edge of the sequent $\overline{TE}$ pulse. The color switch sync circuit 310 is coupled to a trigger signal generator 320 illustrated in FIG. 3B, which generates a SYNC 2 signal and a trigger signal in response to the synchronization of the sync circuit. The SYNC 2 signal causes multiplexer 330 to output the selectively latched color signal to a color code decoder 340. Color code decoder 340 then causes the trigger signal to be applied to the appropriate trigger circuit. During the switching cycle, a blanking pulse is output from the color switch sync circuit 310 to disable the intensity amplifier during the color transition. At the end of the 100 microsecond switching cycle, the intensity amplifier is enabled and the color busy line is returned to its high state indicating that the device is ready to draw new vectors.

In order to eliminate excess power consumption caused by excessive switching, an excessive switch rate circuit 350, illustrated in FIG. 3A, is provided. This circuit determines the switching rate, i.e., the rate of switching from one color to another, and inhibits the switching if a switching rate in excess of 16 color changes in a 25 millisecond time period is determined. This circuit operates as follows.

In response to the selection of a new color, the color change recognition circuit 300 provides a low signal on the switch 1 line. If the signal on the switch 2 line is also low, NOR gates 360 and 370 provide outputs indicating a switch to a new color. The output of NOR gate 360 is coupled to the color switch sync circuit 310 for initiating a switch to the new color. The output of NOR gate 370 is coupled to counter 380 for determining the switching rate. Four bit counter 380 is cleared by a 39 Hz clock signal, thus, if more than 16 color changes are requested with a 25 millisecond period, an overflow signal having a high logic state is coupled to the switch 2 line. When the overflow signal is present on the switch 2 line, no further color switching can occur until the next 39 Hz clock signal clears counter 380. This overflow signal is also coupled to NAND gate 390 which provides a low signal to the data bus indicating that an excessive switch rate has occurred. The overflow signal is further coupled to circuit 400 which latches the occurrence of an overflow signal. The output of latch 400 is coupled to NAND gate 410 such that a 2.44 Hz signal will blink LED 420 in response to the occurrence of the overflow signal. Since the latch 400 is cleared by a 0.61 Hz signal, a single excessive switch rate signal will cause a noticable blinking of the LED 420 to visually alert the user of this condition.

Figure 2:
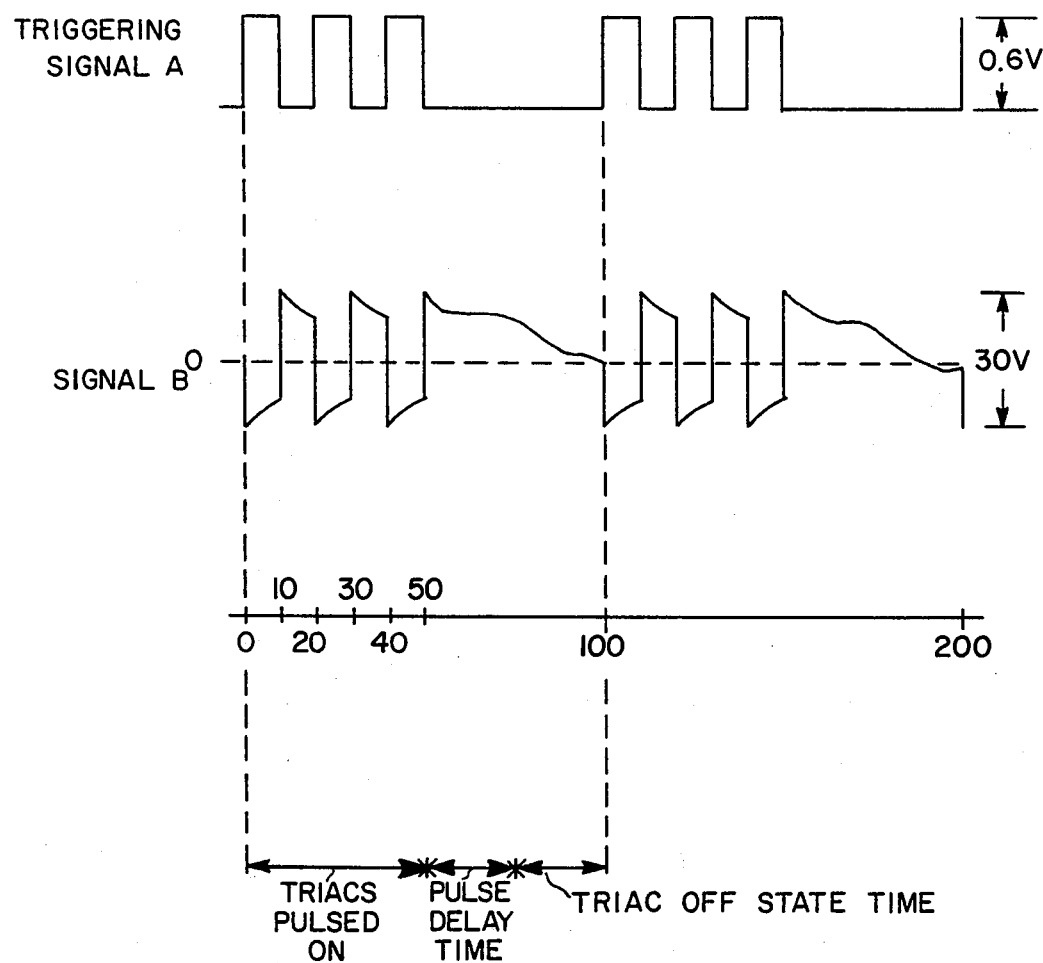
FIG. 2 is an illustration of selected operating waveforms of the circuit of FIG. 1.

Triggering signal A, produced by trigger signal generator 320, is illustrated in FIG. 2. A burst of 0.6 volt pulses is applied to the base of transistor 200 of trigger circuit 170 causing a signal B, also illustrated in FIG. 2, to be generated across the serially coupled primary windings of five toroid transformers. The primary winding 214 of toroid transformer 210 couples signal B to the secondary windings 212 and to the gates of the triacs in the triac string 50 causing the triacs to switch to their conductive state.

Toroid transformer 210 is constructed from a toroid core manufactured by the Ferrox Cube Corporation under part number 846T2503E2A. This core has a very high permeability ($\mu$) of 5,000. This high permeability results in a relatively high inductance with very few turns. In the preferred embodiment, eight turns are used for both the primary winding and for the secondary windings. In the preferred embodiment, the eight turns yield an inductance of 200 $\mu$H. This insures that the 10 microsecond pulse will stay relatively flat for 10 microseconds and will decay to the zero volt level in the 50 microsecond pulse decay time. This characteristic is shown in FIG. 2 as a decay of signal B. This characteristic causes the triacs to be triggered on and to turn off before another string is activated.

Each toroid transformer has one primary winding and three secondary windings. The five toroids are coupled in series to receive signal B, thus each toroid receives a signal of approximately 3 volts across its primary winding. Each secondary winding couples the 3 volt signal to a triac. These secondary windings provide a gate signal relative to the appropriate conductive terminal of each triac sufficient for switching the triac to its conductive state. A 10 ohm resistor coupled in series between each secondary winding 212 and this conductive terminal completes the gate signal path.

Because of the high voltages involved, teflon coated wire is used having the diameter of approximately 0.060 inches. This provides for a 10,000 volt isolation between windings.

The illustrated circuit operates as follows. After the selected triac string has been gated to its conductive state, capacitance $C_{crt}$ charges towards the selected power supply voltage until the current through the selected triac string drops below the holding current level of the individual triacs. This causes the triacs to revert to their non-conductive state unless another pulse is applied to the gate of the triacs. In order to accurately charge the CRT to the power supply level, and in order to maintain a zero voltage differential across the triac string, the triacs in the activated string are triggered periodically. As illustrated in FIG. 2, a burst of three pulses are provided by the color selection circuit 160 each cycle for a period of 50 microseconds. This allows the triacs to conduct the low current levels required to compensate for the beam current from the anode.

After each burst of pulses, a delay time of 50 microseconds is provided before the color selector circuit 160 generates the sequent burst of pulses. The conducting triac string is returned to its non-conductive state during this delay time in response to the signal B decaying to a voltage insufficient to gate the selected triac string. Thus, if a different triac string is selected during the next cycle, the previous triac string will already have been rendered non-conductive.

To ensure that the non-selected triac strings are maintained in non-conductive states, it is necessary to keep the DV/DT across the triacs of these strings at a level below their DV/DT specification. The DV/DT is limited by proper selection of the time constant, R1 *R2 *$C_{crt}/R_{crt}$. In the preferred embodiment resistors R1 and R2 are 50 kilohms, the capacitance $C_{crt}$ of the CRT is approximately 100 pf and the resistance $R_{crt}$ of the CRT is approximately 400 M$\Omega$.

Figure 4:
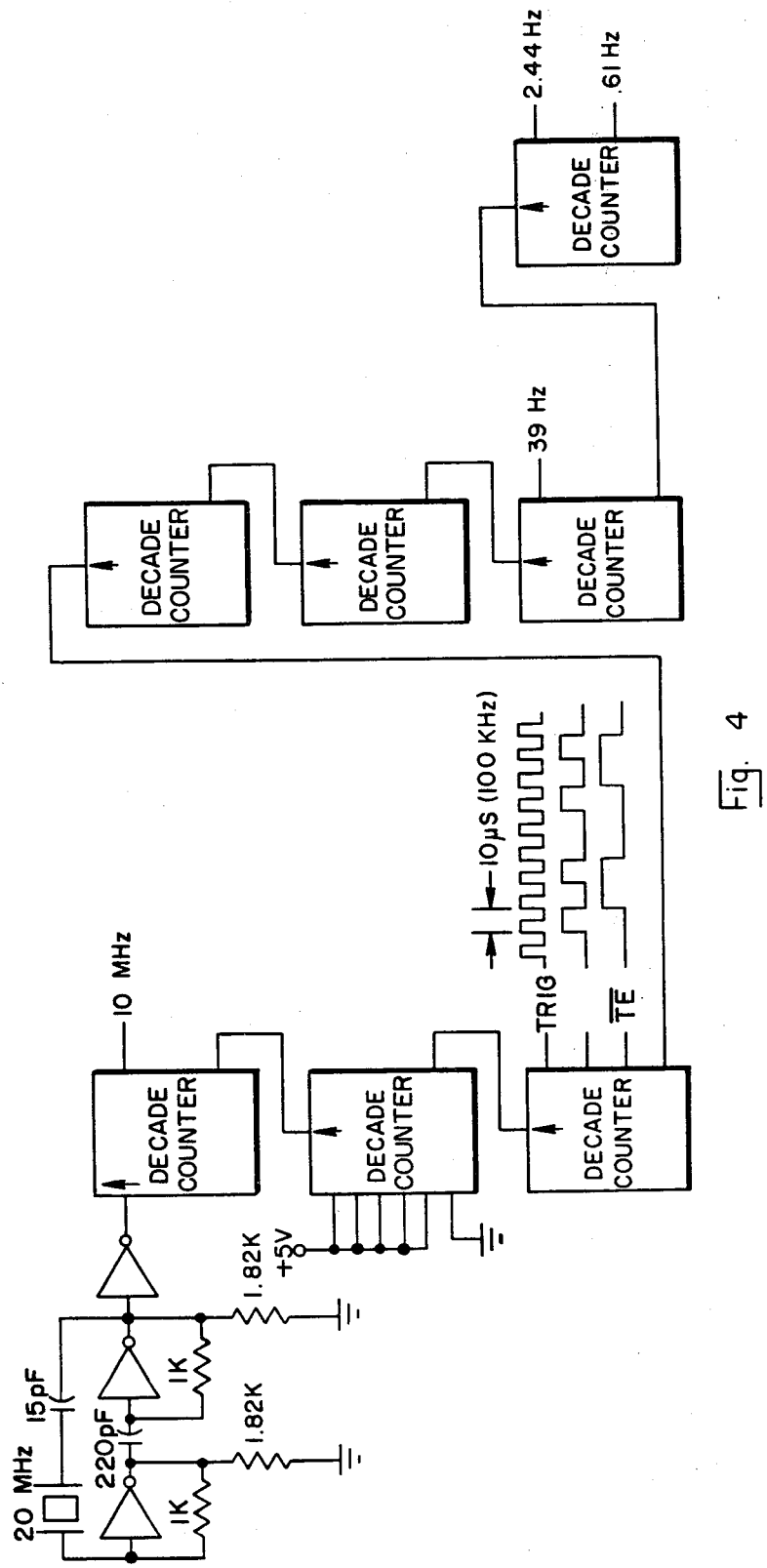
FIG. 4 is a detailed schematic diagram of the clock circuitry which provides the clock signals of the preferred embodiment.

FIG. 4 is a detailed schematic diagram of the clock circuitry 400 which generates the timing signals used in a preferred embodiment. This clock circuitry utilizes decade counters to produce timing signals varying from 10 MHz to 0.61 Hz.

I claim:
1. A bidirectionally conductive switching circuit for selectively coupling a plurality of dc high voltages to a beam penetration CRT, the switching circuit comprising:

a beam penetration CRT possessing a high voltage terminal having a capacitance that can be charged and discharged and also having a resistance high enough to limit the current due to the resistance to a value less than either of the first and second holding currents for the first and second serial strings of triacs recited below:

a first dc voltage supply;

a first serial string of triacs, each triac thereof having first and second conduction terminals and a gate terminal, the conduction terminals coupled serially between the first dc voltage supply and the high voltage terminal of the beam penetration CRT, the first serial string having a first holding current beneath whose value the string will no longer conduct in the absence of a signal applied to the gate terminals;

a first trigger means having a plurality of outputs each individually coupled to an associated gate terminal in the first serial string of triacs, for synchronously applying to the gate terminals a periodic signal switching the triacs conductive to charge the capacitance of the beam penetration CRT toward the voltage of the first dc voltage supply until the charging current falls below the value of the first holding current and for thereafter maintaining the voltage at that level;

a second dc voltage supply of voltage different in value than the voltage of the first dc voltage supply;

a second serial string of triacs, each triac thereof having first and second conduction terminals and a gate terminal, the conduction terminals coupled serially between the second dc voltage supply and the high voltage terminal of the beam penetration CRT, the second serial string having a second holding current beneath whose value the string will no longer conduct in the absence of a signal applied to the gate terminals; and a second trigger means having a plurality of outputs each individually coupled to an associated gate terminal in the second serial string of triacs, for synchronously applying to the gate terminals a periodic signal switching the triacs conductive to discharge the capacitance of the beam penetration CRT toward the voltage of the second dc voltage supply until the discharging current falls below the value of the second holding current and for thereafter maintaining the voltage at that level.

2. A switching circuit as in claim 1 further comprising color selection circuit means for selecting the dc high voltage to be coupled to the beam-penetration CRT in response to an indication of a desired color, and wherein the first and second trigger means are responsive to the color selection circuit means.

3. A switching circuit as in claim 2 wherein the color selection circuit means inhibits color changes occurring at a rate greater than a preselected number of color changes within a preselected length of time.

4. A switching circuit as in claim 3 further comprising a visual indicator responsive to the color selection circuit means, for providing a visual indication indicative that color changes are being inhibited.

\* \* \* \* \*

UNITED STATES PATENT AND TRADEMARK OFFICE
CERTIFICATE OF CORRECTION

PATENT NO. : 4,394,682
DATED : July 19, 1983
INVENTOR(S) : Eugene K. Severson

It is certified that error appears in the above—identified patent and that said Letters Patent is hereby corrected as shown below:

Column 3, line 5, "sequent" should be --subsequent--.

Signed and Sealed this

Eighteenth Day of October 1983

[SEAL]

Attest:

GERALD J. MOSSINGHOFF

Attesting Officer  Commissioner of Patents and Trademarks